United States Patent [19]

Richardson et al.

[11] Patent Number: 5,175,611
[45] Date of Patent: Dec. 29, 1992

[54] MICROWAVE INTEGRATED CIRCUIT PACKAGE TO ELIMINATE ALUMINA SUBSTRATE CRACKING

[75] Inventors: Eric F. Richardson, Sunnyvale; Paul J. Brody, Palo Alto, both of Calif.

[73] Assignee: Watkins-Johnson Company, Palo Alto, Calif.

[21] Appl. No.: 809,699

[22] Filed: Dec. 16, 1991

Related U.S. Application Data

[62] Division of Ser. No. 542,724, Jun. 22, 1990, Pat. No. 5,102,029.

[51] Int. Cl.⁵ .................. H01L 23/02; H01P 3/08; H02B 1/00; H05K 9/00
[52] U.S. Cl. .................. 257/699; 333/246; 333/247; 361/386; 361/387; 361/388; 361/389; 174/35 MS; 257/709; 257/728; 257/772
[58] Field of Search .................. 357/74, 72, 80, 81; 361/386, 387, 388, 389, 401, 406; 333/246, 247; 174/35 MS

[56] References Cited

U.S. PATENT DOCUMENTS 1,184,813 5/1916 Birdsall .
2,065,404 12/1936 Scott .
4,985,753 1/1991 Fujioka et al. .................. 357/80

OTHER PUBLICATIONS

Richardson, E. F., "Select Material to Balance . . . " Microwaves & RF, Jul. 1989, pp. 87-95.
"Carpenter Controlled-Expansion Alloys," brochure by Carpenter Steel Div., Reading, Pa.

Primary Examiner—Andrew J. James
Assistant Examiner—Carl Whitehead, Jr.
Attorney, Agent, or Firm—Thomas E. Schatzel

[57] ABSTRACT

A MIC package housing that reduces or completely eliminates alumina substrate cracking due to thermal expansion rate differences between the housing and the alumina by using a low-expansion iron-nickel alloy, such as commercially available Carpenter 49, made to ASTM Specification A-753-78 (Alloy 2) and MIL-N-14411B (MR) (Composition 3 and 4). Such a housing places compressive stresses no glass-to-metal seals used in hermetic feedthroughs and the glass is fused and the stresses relieved by a special process of annealing. Manufacturing yields are improved and very large alumina substrates can be used and are attached by hard soldering.

9 Claims, 3 Drawing Sheets

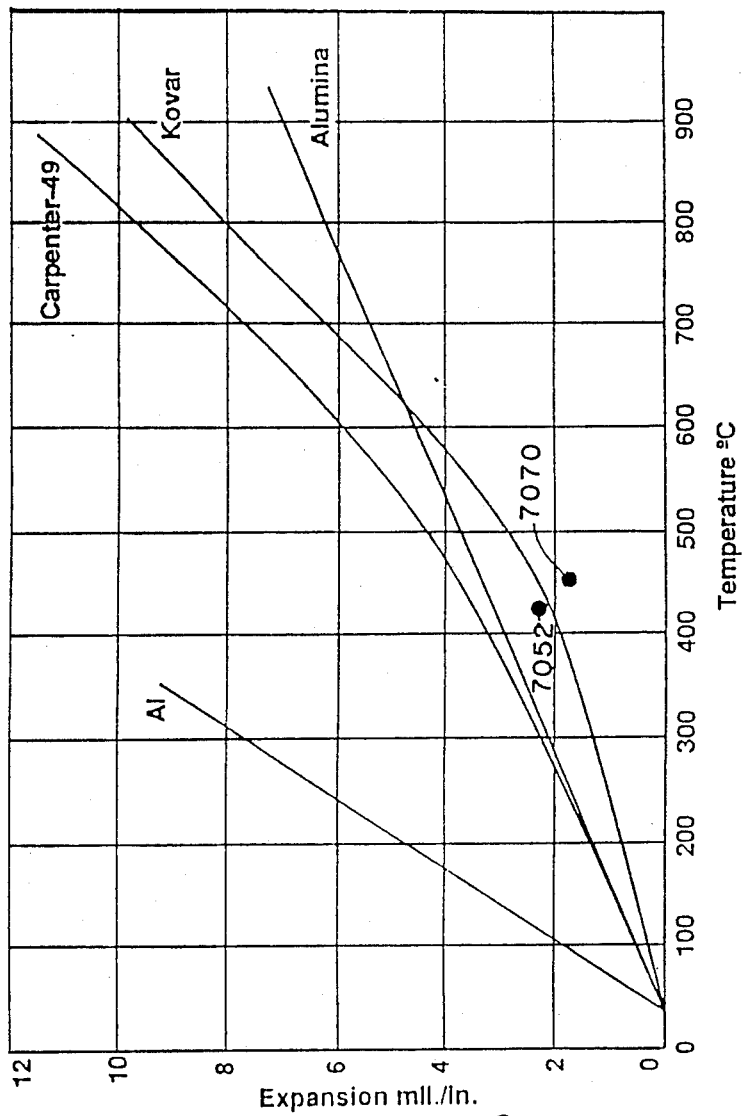
FIG. I (PRIOR ART)
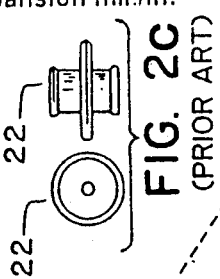
FIG. 2c (PRIOR ART)
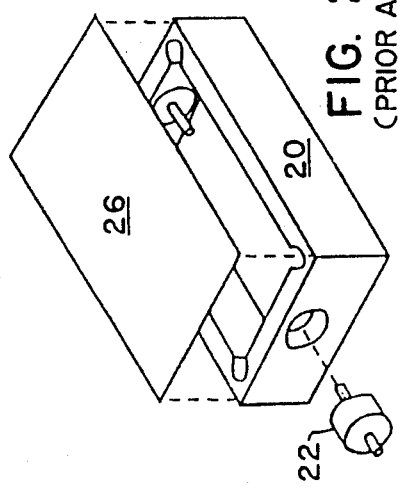
FIG. 2b (PRIOR ART)
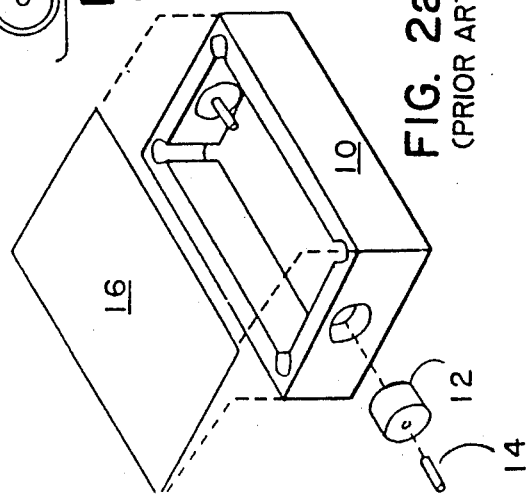
FIG. 2a (PRIOR ART)

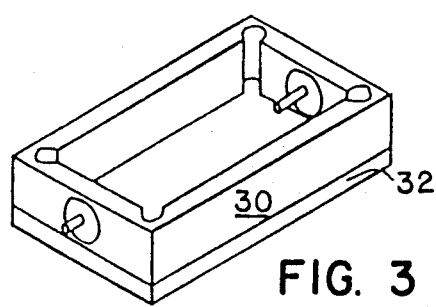
FIG. 3
(PRIOR ART)
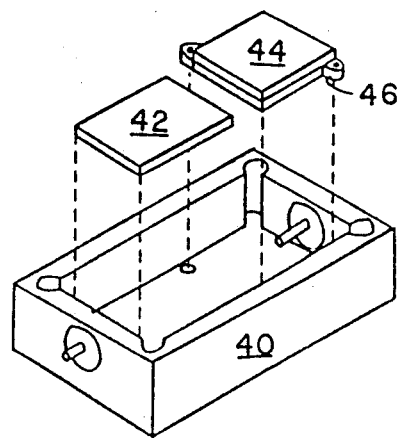
FIG. 4
(PRIOR ART)
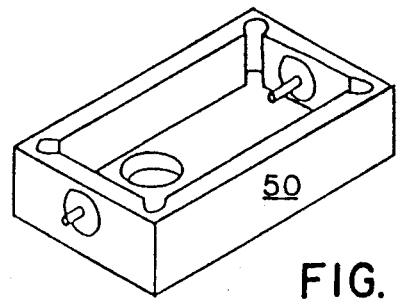
FIG. 5
(PRIOR ART)
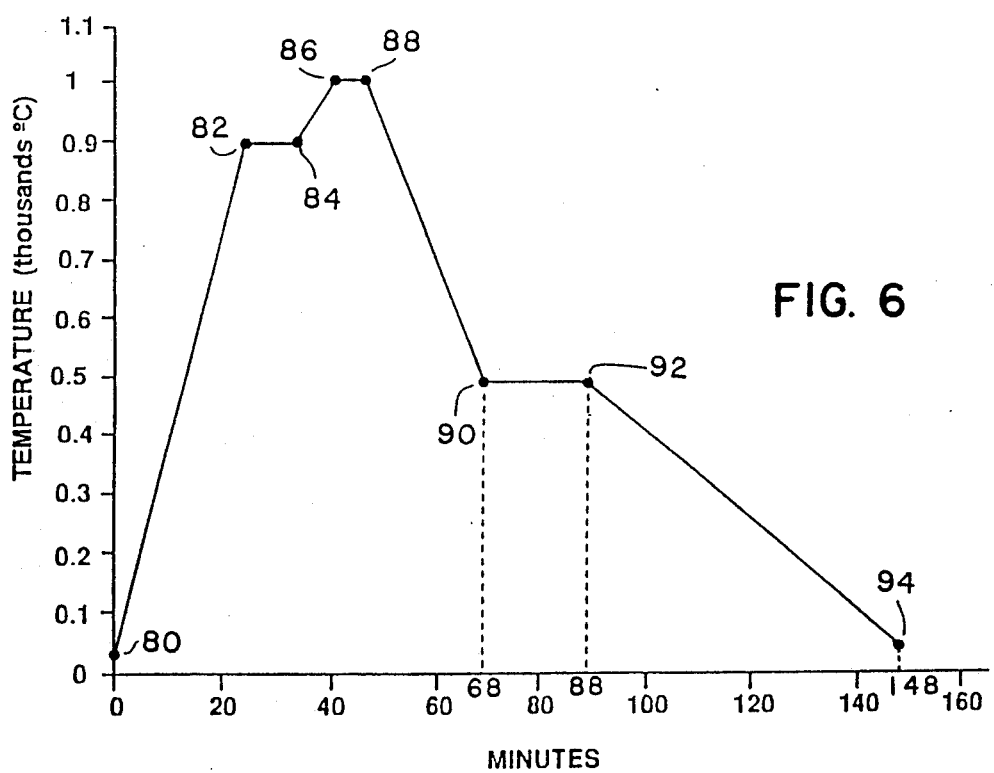
FIG. 6

MICROWAVE INTEGRATED CIRCUIT PACKAGE TO ELIMINATE ALUMINA SUBSTRATE CRACKING

This is a divisional of copending application Ser. No. 07/542,724 filed on Jun. 22, 1990 now U.S. Pat. No. 5,102,029 issued Apr. 7, 1992.

BACKGROUND OF THE INVENTION

1. Field of the Invention

The invention relates generally to hybrid packaging of microwave integrated circuits (MIC) and more specifically to MIC housings incorporating hermetic glass seals and alumina substrates.

2. Description of the Prior Art

The most common MIC packages are gold-plated metal enclosures made from an iron-nickel-cobalt alloy whose chemical composition is controlled within narrow limits to assure precise uniform thermal expansion properties, e.g. Carpenter Kovar ®, referred to below simply as "Kovar." (See, Richardson, E. F., "Select Material to Balance Benefits for Packaged MICs," *Microwaves & RF*, July, 1989, pp. 87–95, paraphrased here; and see "Carpenter Controlled-Expansion Alloys," a sales brochure published by Carpenter Technology, Carpenter Steel Division, Reading, Pa.) Kovar alloy is manufactured by Carpenter Technology to meet the requirements of ASTM Specification F-15-61T (Alloy 2).

Kovar has several benefits as a MIC package material. Most notably, coaxial feedthroughs can be fired directly into a Kovar package using simple processes. Kovar can also be easily welded and plated. And, Kovar is especially compatible with borosilicate glasses for hermetic glass-to-metal seals. The expansion coefficients of the two are closely matched at temperatures less than the setting temperature of the glass. Other metals and other glasses are not so easily matched and most do not form as good a seal as Kovar with borosilicate glass.

MIC packages are also made of aluminum. Kovar and aluminum have widely varying properties and offer different sets of benefits and detriments, when used in MIC packaging. Aluminum compares favorably to Kovar in terms of density, thermal conductivity, machinability and raw material cost. But aluminum cannot have glass seals fired into it, and plating is complicated and problematic compared to Kovar. Aluminum's high rate of thermal expansion makes direct attachment of alumina ceramic substrates impossible.

MIC's for military applications are built in accordance with MIL-M-38510, Appendix G, and MIL-STD-883. Adhesive and polymeric materials are not permissible for use in hermetic sealing according to MIL-M-38510. Therefore, either glass or ceramic are required for feedthroughs as insulating material. Hermetic seals are 100% tested according to MIL-STD-883, Method 1014. The rigorous requirements of MIL-STD-883, Method 1014 demand that superior glass seals and welds exist to prevent unacceptable yield loss.

The need in electronics for glass-to-metal seals is described by Scott, in U.S. Pat. No. 2,065,404, issued Dec. 22, 1936. The basic technique of forming oxides on the surface of iron-nickel alloys that will readily fuse with glass, at ordinary glass blowing temperatures, to form a vacuum-tight seal is described by Scott. Since some carbon always remains in the metal alloy and can cause small glass bubbles to form in a glass seal, Scott suggests that the carbon may be removed by heating the metal in moist hydrogen for at least two hours at a temperature of 950° C.

Vacuum-tight bonds between pre-oxidized Kovar and borosilicate glass are made by heating the joint to the point the glass bonds to the Kovar, which is about 1,000° C. The setting point of glass is approximately the temperature that the glass becomes viscous enough to yield to applied loads. The expansion rates of Kovar and borosilicate glasses are not perfectly matched, but the residual stresses are considered in the prior art to be negligible.

Corning Glass Works (Corning, N.Y.) borosilicate glasses 7052 and 7070 are preferred for use in feedthroughs, because these glasses are rugged, resist corrosion, and have the relatively low dielectric constants of 4.9 and 4.1, respectively. For microwave packaging, a constant impedance, usually 50Ω for all feedthroughs, is desired for optimum electrical performance. A lower dielectric constant ($\epsilon_r$) allows a smaller outside diameter ($d_o$) for a given impedance ($Z_o$) and center pin size ($d_i$), in accordance with Formula I. A smaller diameter feedthrough allows the package height to be minimized, with a decrease in size and weight.

FORMULA I $$Z_o = (60\Omega)(\epsilon_r)^{-\frac{1}{2}} ln(d_o/d_i)$$

The thermal expansion rates of various MIC package materials are illustrated in FIG. 1. Notice in FIG. 1 that Kovar's expansion rate is lower than that of most other metals and is very close to that of the borosilicate glasses 7052 and 7070 at about 425°–450° C. In addition to permitting low stress glass-to-metal seals, this low thermal expansion characteristic allows Kovar to act as an acceptable carrier for ceramic substrates such as alumina (nominal 99.6% $Al_2O_3$).

Special measures however must be taken in account in attaching alumina substrates to Kovar bases. The difference in the thermal expansion rates of Kovar and aluminum results in residual stress when the two materials are bonded at elevated temperatures and then cooled. (The minimum service temperature for the military and other severe applications is −55° C.) This stress can lead to alumina cracking and reduced yields. Since the stress is proportional to the difference in thermal expansion rates and temperature difference, the greater the bonding temperature, the greater the likelihood of alumina cracking. The maximum residual stress is tensile, which magnifies the problem since alumina is much weaker in tension compared to compression. In addition, the magnitude of the stress will change due to temperature cycling (which occurs in manufacturing screening and end use), and that also increases the probability of alumina cracking.

Hard solders, such as eutectic 88% Au/12% Ge, are preferred to attach the substrate to the package because of their excellent reliability, and good thermal conductivity. The hard solders' high processing temperatures allows the substrate attach joints to remain unaffected by subsequent manufacturing steps. In the prior art, alumina substrates are kept small in size, often well under a half square inch. Physical discontinuities in the substrate which cause stress concentration include metalized through holes for attachment of semiconductor devices to the package floor to improve thermal and/or electrical performance and metalized through holes for electrical grounding. These physical discontinuities can roughly triple the thermally induced stress. Epoxy and soft tin-lead and indium-lead type solders are sometimes used to attach alumina to Kovar because these materials are slightly pliable and will give a little without rupture. Also, these materials cause less residual stress since bonding is accomplished at lower temperatures. Soft solders and epoxy are considerably less reliable than hard solders, they have degraded thermal behavior, and they have process temperatures which may conflict with other hybrid manufacturing operations.

Referring to FIG. 2(a) and 2(b), feedthroughs are installed in a MIC package 10 by either firing the feedthrough glass 12 directly into the package 10, as in FIG. 2(a); or in a MIC package 20 by soldering-in a pre-fired feedthrough 22 as in FIG. 2(b). Kovar lends itself to both resistance and laser welding, and a gold-plated MIC package, e.g., package 20, could have a lid 26 solder sealed to it. Solder sealing is difficult to rework and solder balls can form inside the MIC package, so welding is usually preferred. The wide variety of welding options gives Kovar a major advantage over using other metals.

After firing or welding, Kovar packages are usually plated with nickel, followed with high-purity gold (99.9%+). This gives good corrosion resistance and good surfaces for soldering and wire bonding. Alumina ceramic substrates can be attached to such surfaces with gold-tin and gold-germanium eutectic solder without using flux, resulting in high reliability, and good thermal and electrical performance. The alumina substrates must be kept small with careful attention to avoiding stress concentrations.

Kovar has additional disadvantages as a MIC packaging material. Kovar has low thermal conductivity, making it unsuitable in high-powered applications, unless special measures, known in the prior art, are taken. These special measures include using beryllia (nominal 99% BeO) substrates—which have high thermal conductivity, mounting molybdenum carriers inside the MIC package, or brazing copper inserts into the MIC package floor. For example: In FIG. 4, a Kovar housing 40 has a BeO substrate 42 and a ceramic substrate 44 mounted to a molybdenum carrier 46; and in FIG. 5, a Kovar housing 50 has a copper insert 52. Each of these special measures increase costs significantly. Kovar's machinability is poor, and its density is similar to steel.

Aluminum appears to be an excellent alternative to Kovar for MIC packages. Aluminum alloy 6061 is commonly used for electronic packaging applications. Its density equals one third that of Kovar, it has ten times higher thermal conductivity, and it has roughly two to three times improved machinability. These better material properties promise a lighter, higher power, and lower cost package. The advantages, however, are offset by a strong set of disadvantages, including:

(1) Glass seals cannot be fired directly into the package, because of aluminum's low melting point and high thermal expansion rate. The metal must first be plated, and then a pre-fired feedthrough is inserted and soldered. The plating requirements for successful feedthrough installation can conflict with other package plating requirements. Gold plating is used, along with tin and nickel. The large expansion mismatch between the aluminum and Kovar-glass feedthrough causes residual stress in the solder. Temperature cycling will eventually cause these joints to fail.

(2) Aluminum is one of the most difficult metals to plate, due to its surface oxide.

(3) Aluminum's high thermal conductivity necessitates utilization of high power welding equipment to seal a cover on the MIC package. A laser is often used. The high welding power is countered by designing a package that has thicker walls than the Kovar equivalent to accommodate the weld and is also designed taller to prevent the welding from damaging the solder joints on the feedthroughs.

(4) The larger size of an aluminum MIC over a Kovar equivalent partially offsets the otherwise large weight savings in using aluminum.

(5) Aluminum has a high rate of thermal expansion that prevents direct soldering of thin film ceramic substrates. Substrates are therefore soldered to metal carriers that are mechanically fastened or epoxy bonded to the MIC package. Epoxies can create reliability problems when improperly stored or handled. Improperly installed fasteners can also reduce reliability. This additional material adds cost and complexity to the manufacturing operation.

While aluminum does offer many benefits, many new problems are concurrently introduced. The problems in attaching alumina substrates are exacerbated when using aluminum for a MIC package.

Low carbon or stainless steel can be used to fabricate MIC packages with coaxial feedthroughs. (Richardson, p. 95.) Glass seals can be fired directly into either type of steel, forming "compression seals." Compression seals between substances having different coefficients of linear expansion is described by Birdsall in U.S. Pat. No. 1,184,813, issued May 30, 1916. Since steel expands at a faster rate than the glass typically used, feedthroughs will have residual compression forces in the glass. The prior art considers compression seals not to be as reliable as matched seals. Both low carbon steel and stainless steel are readily welded using the same processes that are used for Kovar, and plating is equivalent to Kovar. Neither metal is well matched to the thermal expansion rate of alumina, and precautions must therefore be taken to minimize size and stress concentration if hard solders are used.

A low expansion housing material that matches the thermal expansion of alumina will not be directly compatible with ordinary borosilicate glass seals. Simply combining an alloy of 0.02% C, 0.50% Mn, 0.35% Si, 48.0% Ni, and Iron to balance, such as Carpenter High Permeability "49" ®, as the housing material with the borosilicate glass results in residual compressive stresses in the glass that have prevented such use in the prior art. By using the methods of the present invention such compressive stresses are reduced through careful annealing of the glass seals after fusing. If a normal Kovar sealing process were used, i.e., without annealing, the seals would not be able to withstand the rigors of hybrid assembly and MIL-STD-883 screening. The present invention includes a preferred method of annealing suitable for high reliability MIC package manufacturing.

The low expansion material provides an ideal thermal expansion match to alumina. This permits directly attaching large substrates, with through holes, to the MIC package with various bonding materials, including hard solder.

SUMMARY OF THE PRESENT INVENTION

It is therefore an object of the present invention to provide a MIC housing that is easy to plate, easy to weld, has a low thermal expansion coefficient, and forms good hermetic glass seals.

It is a further object to have glass seals withstand the rigors of hybrid manufacturing and MIL-STD-883 screening.

It is a further object to eliminate cracking of alumina substrates attached to MIC packages.

Briefly, a preferred embodiment of the present invention includes a MIC housing made of (1) an iron-nickel alloy having a thermal expansion coefficient matching alumina, e.g., Carpenter 49; (2) borosilicate glass seals for electrical feedthroughs; and (3) at least one alumina substrate.

An advantage of the present invention is that fewer field failures will occur due to defective and leaking glass seals.

Another advantage of the present invention is that alumina ceramic substrates larger than one quarter square inch may be reliably hard soldered to a MIC housing.

Another advantage of the present invention is that cracking of alumina substrates is substantially eliminated, thus increasing manufacturing yields.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a chart of temperature-versus-linear expansion for various materials used in glass-to-metal seals;

FIG. 2(a) is a perspective view of a prior art feedthrough being installed in a MIC package by firing the glass directly into the package. FIG. 2(b) shows a prior art pre-fired feedthrough being soldered into a MIC package. FIG. 2(c) is a top and a side view of the pre-fired feedthrough of FIG. 2(b);

FIG. 3 is a perspective view of a prior art MIC housing using a high-conductivity floor;

FIG. 4 is a perspective view of a prior art MIC housing having special substrates and carriers;

FIG. 5 is a perspective view of a prior art MIC housing having a copper insert;

FIG. 6 is a time-versus-temperature chart of the glass annealing process in an atmosphere of nitrogen for the glass seals of the present invention;

DETAILED DESCRIPTION OF THE PREFERRED EMBODIMENTS

Figure 7:
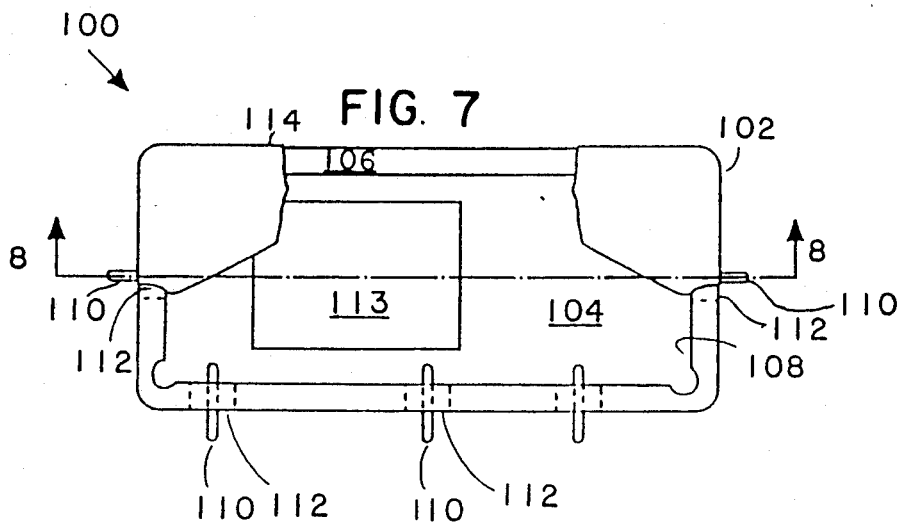
FIG. 7 is a top view of an exemplary MIC housing incorporating the present invention.

Ideally, a MIC housing will plate easily, weld readily, have good hermetic glass-to-metal sealing properties, and match alumina's thermal expansion rate. MIC housings are additionally constrained in the glass that may be employed in the glass seals. Predominantly borosilicate glasses are used because of their superior corrosion resistance and relatively low dielectric constant. A low dielectric constant helps maintain the necessary circuit impedances at small diameters, thereby keeping the overall housing size small. Other glass types, e.g., soda-lead-potash glasses are unsuitable because, (1) the dielectric constant is too high thereby increasing the housing's size in order to maintain circuit impedances, and (2) they have poor corrosion resistance.

An alloy of 0.02% C, 0.50% Mn, 0.35% Si, 48.0% Ni, and Iron to balance, such as Carpenter High Permeability "49" ®, referred to below as Carpenter 49, has been discovered by the present inventors to be particularly useful in MIC housings. Carpenter 49 is a nickel-iron alloy which has a saturation flux density of approximately 15,000 gasses after hydrogen annealing and is principally known for applications in magnetic shields, solid cores for solenoids, and other control devices using magnetics. Carpenter 49 is easy to plate, easy to weld, has a low thermal expansion coefficient, and forms good hermetic glass seals. Carpenter 49, when used as a base for attaching alumina substrates, will not cause cracking in the alumina substrates because the minor thermal expansion mismatch between alumina and Carpenter 49 results in very low induced stress. In addition, because Carpenter 49 expands and contracts more rapidly than alumina, the maximum induced stress in the alumina is compressive. Alumina is ten times stronger in compression compared to tension. The key to successfully using Carpenter 49 in a MIC housing has been found by the inventors to be the annealing process used to form the glass-to-metal hermetic seals. The thermal expansion rate of the desired borosilicate glass is less than that of Carpenter 49 at the setting point of the glass. Therefore, annealing of the glass must be performed to relieve the residual compressive stresses in the glass which occur during the firing process. Such an annealing ensures a reliable glass seal that will withstand the rigors of environmental screening as defined by, but not limited to, MIL-STD-883.

Prior to firing glass seals, all MIC package housings are subjected to: (1) chemical cleaning by dipping housings in a hot HCl acid bath, (2) decarburizing/metal outgassing in a 1100° C. wet $H_2$ atmosphere with 50%–60% R.H., and (3) oxidizing in an air environment to grow an iron-oxide layer on the housing between two and ten microinches.

FIG. 6 shows the required time versus temperature profile to form a good glass-to-metal seal that has been properly annealed. In an atmosphere of nitrogen and beginning at room temperature, at a point 80, the temperature is raised to approximately 900° C. to a point 82 and held there for approximately ten minutes to a point 84. The temperature is then raised again to approximately 1000° C. at a point 86 and held for approximately three minutes until a point 88. The temperature is then lowered to approximately 490° C. to a point 90, held for approximately twenty minutes at that temperature until a point 92, and then allowed to cool down to room temperature over approximately a sixty minute time period to a point 94.

Figure 8:
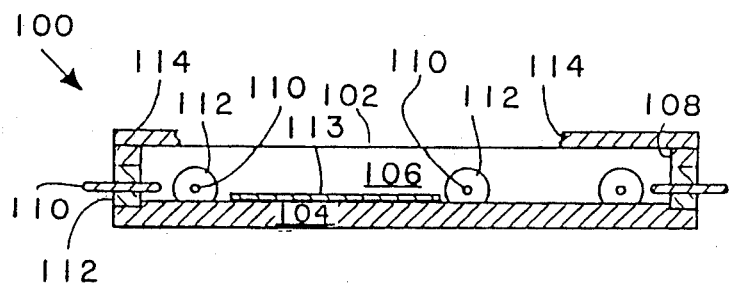
FIG. 8 is a cross-sectional view of the exemplary MIC housing of FIG. 7 taken along the line 8—8.
Figure 9:
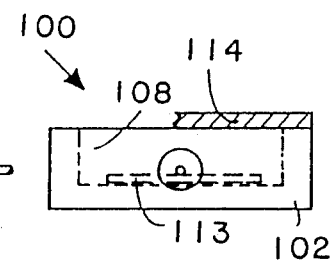
FIG. 9 is an end view of the exemplary MIC housing of FIG. 7.
Figure 10:
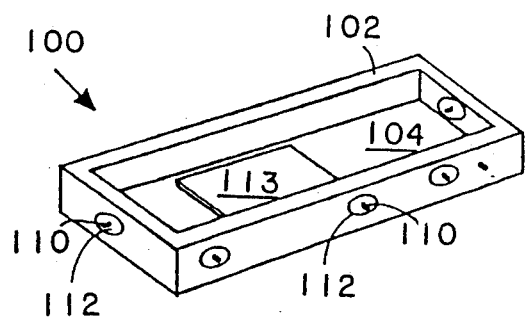
FIG. 10 is an isometric view of the exemplary MIC housing of FIG. 7.

FIGS. 7–10 show an exemplary embodiment of the present invention in a MIC package, referred to by the general reference character 100. MIC package 100 has a housing 102 made of an alloy of substantially 0.02% C, 0.50% Mn, 0.35% Si, 48.0% Ni, and enough iron to balance such that the thermal expansion rate of the alloy substantially matches that of alumina at approximately 400° C. One example of such a commercially available alloy is Carpenter High Permeability 49, from Carpenter Technology Corporation. Preferably, the housing 102 is nickel plated and then gold plated to enable soldering later. The housing 102 comprises a floor 104 and a wall 106 around the perimeter of the floor 104 thereby forming a cavity 108. Housing 102 is chemically cleaned using a heated hydrochloric acid bath; and then decarburized in a wet hydrogen environment. Housing 102 is then oxidized in an air environment to grow an iron oxide on the surface of the housing with a thickness of 2-10 microinches. The oxide layer helps to wet the glass during firing and promotes a hermetic metal-to-glass bonding. A plurality of terminals 110, each with a glass seal 112, are then fixtured into the housing 102 using appropriate graphite fixturing. The glass seals 112 are fused/annealed in an atmosphere of nitrogen, according to the thermal profile of FIG. 8. The latter half of the profile in FIG. 8, the annealing, relieves compressive stresses in the glass seals 112. The housing 102 is then suitable for attaching an alumina ceramic substrate 113 directly to the floor 104. Alumina ceramic substrates are attached using a "hard solder" gold-tin or gold-germanium eutectic solder (without flux). A suitable lid 114, such as nickel, Kovar, or nickel/gold plated Kovar, is welded over cavity 108 to form a hermetic seal of any electrical components contained within the cavity 108. Nickel and Kovar are preferred lid materials because of their availability and qualification for military procurement. Preferably, an inert gas (not shown), such as nitrogen, is used to fill the cavity 108 and the gas is contained by lid 114. Circuits are completed to the environment outside housing 102 through the terminals 110.

In addition to its use in MIC housings, embodiments of the present invention include Joint Electrical & Defense Electronics Committee (JEDEC) Specification for "TO-8" and other "TO" series transistor packages. Ceramic-to-metal seals are used in all types of electronics devices. These seals often consist of a metallized and plated alumina or beryllia brazed to a Kovar alloy member. (See, p. 7, "Carpenter Controlled-Expansion Alloys," a sales brochure published by Carpenter Technology, Carpenter Steel Division, Reading, PA.) By using the techniques described above, the manufacturing yields of devices using Carpenter 49 will be improved by the elimination of alumina substrate 113 cracking.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. An electronic device package, comprising:
a housing of an alloy material, the housing having a cavity, said alloy being substantially 0.02% C, 0.50% Mn, 0.35% Si, 48.0% Ni, and the balance being substantially iron such that the thermal expansion rate of the alloy substantially matches that of alumina (nominal 99.6% $Al_2O_3$), the housing being decarburized and oxidized;
at least one feedthrough comprising a terminal disposed within a borosilicate glass seal fused into the housing and annealed to relieve compressive stresses within said glass seal; and
an alumina ceramic substrate attached within said cavity of the housing.

2. The package of claim 1, further including:
a lid to hermetically enclose said cavity.

3. The package of claim 2, wherein:
the lid is suitable for joining and sealing to the housing by welding or soldering.

4. The package of claim 1, further including:
an inert gas at substantially one atmosphere of pressure contained in said cavity by the lid.

5. The package of claim 1, wherein:
the electronics package is a MIC housing.

6. The package of claim 1, wherein:
the electronics package is a JEDEC "TO" series transistor case.

7. The package of claim 1, wherein:
the alumina ceramic substrate has at least one through-hole used in a circuit contained thereon, whereby more highly integrated hybrids are possible without sacrificing manufacturing yields.

8. The package of claim 1, wherein:
the housing is plated with a first layer of a material comprising substantially nickel, and the first layer is plated with a second layer of a material comprising substantially gold.

9. The package of claim 1, wherein:
a hard solder is disposed between said alumina ceramic substrate and said housing so as to attach said alumina ceramic substrate to said housing, the hard solder is one from a group of gold-tin eutectic solder and gold-germanium eutectic solder.

* * * * *